US012591997B2

(12) United States Patent
Hwang et al.

(10) Patent No.: US 12,591,997 B2
(45) Date of Patent: Mar. 31, 2026

(54) ARRANGEMENT DEVICE AND METHOD

(71) Applicant: AUROS TECHNOLOGY, INC.,
Hwaseong-si (KR)

(72) Inventors: Sol-Lee Hwang, Hwaseong-si (KR);
Hye-Ji Im, Hwaseong-si (KR)

(73) Assignee: AUROS TECHNOLOGY, INC.,
Hwaseong-si (KR)

( * ) Notice: Subject to any disclaimer, the term of this
patent is extended or adjusted under 35
U.S.C. 154(b) by 396 days.

(21) Appl. No.: 18/210,943

(22) Filed: Jun. 16, 2023

(65) Prior Publication Data

US 2024/0249436 A1     Jul. 25, 2024

(30) Foreign Application Priority Data

Jan. 25, 2023    (KR) ........................ 10-2023-0009469

(51) Int. Cl.
G06T 7/73          (2017.01)
G06T 7/00          (2017.01)
G06T 7/13          (2017.01)
G06T 7/136         (2017.01)
(Continued)

(52) U.S. Cl.
CPC .................. G06T 7/75 (2017.01); G06T 7/13
(2017.01); G06T 7/136 (2017.01); G06T 7/90
(2017.01); G06T 7/97 (2017.01); H10P 74/203
(2026.01); G06T 2207/30148 (2013.01)

(58) Field of Classification Search
CPC .. G06T 7/75; G06T 7/13; G06T 7/136; G06T
7/90; G06T 7/97; G06T 2207/30148;

G06T 7/0006; G06T 7/62; G06T 7/66;
G06T 7/70; H01L 22/12; H01L 21/68;
H01L 21/681; H01L 21/67259
See application file for complete search history.

(56) References Cited

U.S. PATENT DOCUMENTS

| | | | | |
|---|---|---|---|---|
| 4,975,972 A | * | 12/1990 | Bose | .......................... G06T 5/30 |
| | | | | 382/172 |
| 2018/0068199 A1 | * | 3/2018 | Itoh | ........................... G06T 7/11 |
| 2021/0358165 A1 | * | 11/2021 | Simkin | ................... G06V 10/75 |

(Continued)

FOREIGN PATENT DOCUMENTS

| | | | | | |
|---|---|---|---|---|---|
| CN | 1975997 A | * | 6/2007 | ........... | G01B 11/002 |
| CN | 109671052 A | * | 4/2019 | ............... | G06T 7/64 |

(Continued)

OTHER PUBLICATIONS

Korean Office Action for related KR Application No. 10-2024-0055832 mailed Aug. 9, 2024 from Korean Intellectual Property Office.

(Continued)

*Primary Examiner* — Henok Shiferaw
*Assistant Examiner* — Woo C Rhim
(74) *Attorney, Agent, or Firm* — Paratus Law Group, PLLC

(57)          ABSTRACT
An arrangement device includes: a detector obtaining an image in a field of view (FOV) of a wafer, and a processor digitalizing the obtained image into black and white to model an edge line, and identifying a central position of the wafer by using the modeled edge line. The processor stores three reference points placed at half of a width and half of a height of the FOV, and obtains the image at each of the three reference points.

15 Claims, 6 Drawing Sheets

(51) Int. Cl.
    *G06T 7/90*           (2017.01)
    *H10P 74/20*         (2026.01)

(56)            References Cited

U.S. PATENT DOCUMENTS

| | | | |
|---|---|---|---|
| 2021/0407099 A1 * | 12/2021 | Lee | G06T 7/136 |
| 2022/0392110 A1 * | 12/2022 | De Almeida Barreto | |
| | | | A61B 1/00009 |
| 2024/0249436 A1 * | 7/2024 | Hwang | G06T 7/13 |

FOREIGN PATENT DOCUMENTS

| | | | | | |
|---|---|---|---|---|---|
| CN | 111276412 A | * | 6/2020 | | H01L 22/26 |
| CN | 111815565 A | * | 10/2020 | | G06T 7/62 |
| CN | 114549599 A | * | 5/2022 | | G06T 7/13 |
| DE | 102019218969 A1 | * | 6/2020 | | H01L 22/26 |
| JP | H06309437 A | * | 11/1994 | | |
| JP | H0864660 A | * | 3/1996 | | |
| JP | 2000114347 A | * | 4/2000 | | |
| JP | 2005093678 A | * | 4/2005 | | |
| JP | 2006093333 A | * | 4/2006 | | |
| JP | 2007103645 A | * | 4/2007 | | |
| JP | 2011216789 A | * | 10/2011 | | |
| JP | 2011249572 A | * | 12/2011 | | |
| JP | 2014027108 A | * | 2/2014 | | |
| JP | 2015182175 A | * | 10/2015 | | |
| JP | 2016156654 A | * | 9/2016 | | |
| KR | 10-2000-0044563 A | | 7/2000 | | |
| KR | 10-2007-0048650 A | | 5/2007 | | |
| KR | 20070048650 A | * | 5/2007 | | G03F 9/7011 |
| KR | 10-0976604 B1 | | 8/2010 | | |
| KR | 10-1478249 B1 | | 12/2014 | | |
| KR | 10-2018-0136771 A | | 12/2018 | | |
| KR | 102460132 B1 | * | 10/2022 | | G03F 7/70683 |
| WO | WO 2006/025386 A1 | | 3/2006 | | |

OTHER PUBLICATIONS

Japanese Office Action for related JP Application No. 2023-117700 mailed Sep. 3, 2024 from Japan Patent Office.
Taiwanese Office Action for related TW Application No. 112124184 mailed Jan. 5, 2024 from Taiwan Intellectual Property Office.

* cited by examiner (a)

(b)

(a)                                                    (b)

(c)

(a)

(b)

(a)

Wafer (b)        (c)        (d)

Gauge (e)        (f)        (g)

ARRANGEMENT DEVICE AND METHOD

CROSS-REFERENCE TO RELATED APPLICATION

This application claims priority to Korean Patent Application No. 10-2023-0009469 (filed on Jan. 25, 2023), which is hereby incorporated by reference in its entirety.

BACKGROUND

The resent disclosure relates to an arrangement device and method that corrects a central position of a wafer.

With the advancement in technologies, the size of a semiconductor device measuring the characteristics of a wafer decreases, and the density of the integrated circuit of a measurement device increases. For an integrated circuit to be formed on a wafer, a desired circuit structure and desired elements need to be consecutively formed in a specific position, in a series of manufacturing processes. In the manufacturing processes, a patterned layer is consecutively formed on a wafer.

In the repetitive stack processes, an electrically activated pattern is generated in the integrated circuit. At this time, unless each pattern is arranged within a range of errors that are allowable in the production process, the performance and reliability in manufactured circuits deteriorate, since electrically activated patterns interfere with one another. To prevent this from happening, various types of measurement devices check the arrangement state of the patterns.

A measurement device performs measurement based on a recipe, but in the case where the global position in relation to a wafer in the recipe differs from the position of a wafer actually mounted on a chuck, measurement errors can occur. At this time, the global position of the recipe needs to be corrected.

SUMMARY

The objective of the present disclosure is to provide an arrangement device and method that can identify the central position of a wafer.

The objective of the present disclosure is to provide an arrangement device and method that can correct the global position of a recipe.

Aspects according to the present disclosure are not limited to the above ones, and other aspects and advantages that are not mentioned above can be clearly understood from the following description and can be more clearly understood from the embodiments set forth herein. Additionally, the aspects and advantages in the present disclosure can be realized via means and combinations thereof that are described in the appended claims.

An arrangement device of one embodiment comprises a detector obtaining an image in a field of view (FOV) of a wafer, and a processor digitalizing the obtained image into black and white to model an edge line and identifying a central position of the wafer by using the modeled edge line.

An arrangement method of one embodiment comprises obtaining an image in an FOV of a wafer, digitalizing the obtained image into black and white, modeling an edge line in the digitalized image, and identifying a central position of the wafer by using the modeled edge line.

According to the present disclosure, in the case where an image of three points is obtained, the central position of a wafer may be determined, ensuring a speed.

According to the present disclosure, after digitalization of an image, an edge line is modeled, ensuring a simplification and a speed.

According to the present disclosure, gray values are compared based on a unit of pixel, in a digitalized image, ensuring an accurate edge line.

According to the present disclosure, an edge line is accurately modeled with a gauge (reflection plate).

According to the present disclosure, one of an X value or a Y value is calculated at three points, to obtain an offset value, identifying the central position readily.

Specific effects are described along with the above-described effects in the section of detailed description.

BRIEF DESCRIPTION OF THE DRAWINGS

The accompanying drawings constitute a part of the specification, illustrate one or more embodiments in the disclosure, and together with the specification, explain the disclosure.

DETAILED DESCRIPTION

Figure 1:
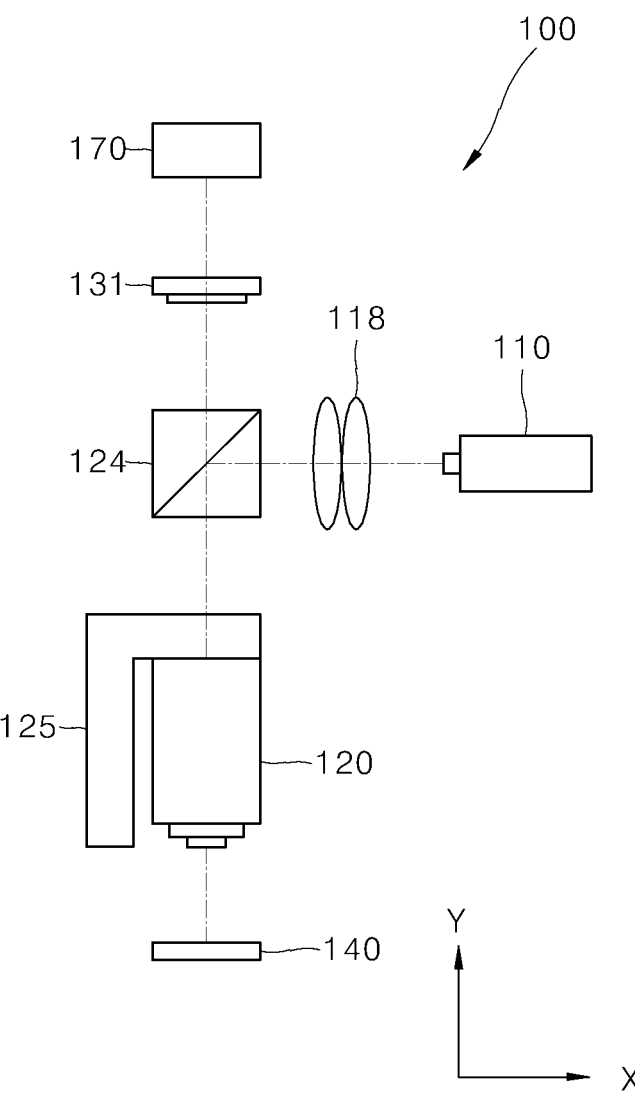
FIG. 1 is a conceptual view showing an arrangement device of one embodiment.

The above-described aspects, features and advantages are specifically described hereafter with reference to accompanying drawings such that one having ordinary skill in the art to which the present disclosure pertains can embody the technical spirit of the disclosure easily. In the disclosure, detailed description of known technologies in relation to the subject matter of the disclosure is omitted if it is deemed to make the gist of the disclosure unnecessarily vague. Hereafter, preferred embodiments according to the disclosure are specifically described with reference to the accompanying drawings. In the drawings, identical reference numerals can denote identical or similar components.

The terms "first", "second" and the like are used herein only to distinguish one component from another component. Thus, the components are not to be limited by the terms. Certainly, a first component can be a second component, unless stated to the contrary.

When any one component is described as being "in the upper portion (or lower portion)" or "on (or under)" another component, any one component can be directly on (or under) another component, and an additional component can be interposed between the two components.

When any one component is described as being "connected", "coupled", or "connected" to another component, any one component can be directly connected or coupled to another component, but an additional component can be "interposed" between the two components or the two components can be "connected", "coupled", or "connected" by an additional component.

Throughout the disclosure, each component can be provided as a single one or a plurality of ones, unless explicitly stated to the contrary.

The singular forms "a", "an" and "the" are intended to include the plural forms as well, unless explicitly indicated otherwise. It is to be further understood that the terms "comprise" or "include" and the like, set forth herein, are not interpreted as necessarily including all the stated components or steps but can be interpreted as exCluding some of the stated components or steps or can be interpreted as including additional components or steps.

Throughout the disclosure, the terms "A and/or B" as used herein can denote A, B or A and B, and the terms "C to D" can denote C or greater and D or less, unless stated to the contrary.

Hereafter, described are an arrangement device and an arrangement method identifying the central position of a wafer, in several embodiments.

FIG. 1 is a conceptual view showing an arrangement device of one embodiment.

Referring to FIG. 1, the arrangement device 100 of one embodiment photographs any point of the edge of a wafer 140 to identify a central position of the wafer 140 accurately.

The arrangement device 100 of one embodiment may comprise a light source 110, a relay lens 118, a detector 131, a beam splitter 124, an objective lens 120, a lens focus actuator 125, and a processor 170.

FIG. 1 shows the configuration of the arrangement device 100 of FIG. 1, in one embodiment, and components of the arrangement device 100 are not limited to those of the embodiment of FIG. 1. When necessary, some of the components may be added, modified or removed. For example, the arrangement device 100 may comprise a memory (not illustrated) storing instructions, programs, logic and the like that allow the processor 170 to control each of the components of the arrangement device 100.

The light source 110 emitting light may comprise a halogen lamp, a xenon lamp, a supercontinuum laser, a light-emitting diode, or a laser induced lamp and the like.

The detector 131 detects light in a field of view (FOV), and obtains an image seen in the FOV. The detector 131 photographs a wafer 140 placed on a chuck and the background of the wafer 140 (or the shadow of the wafer 140 and a gauge (a reflection plate)), to obtain an image in the FOV, under the control of the processor 170.

The beam splitter 124 splits light into two light rays. Light irradiated from the light source 110 is split into two light rays by the beam splitter 124 through the relay lens 118, in the state of being polarized.

The objective lens 120 is disposed at the lens focus actuator 125. For example, the magnification of the objective lens 120 may be less than that of an objective lens for overlay measurement.

The lens focus actuator 125 adjusts a distance between the objective lens 120 and the wafer 140 to adjust a focus. The lens focus actuator 125 may move the objective lens 120 perpendicularly in the direction of the wafer (e.g., the Y direction), under the control of the processor 170, to adjust a focal distance.

The processor 170 models the edge line of the wafer 140 in the image obtained by the detector 131, and calculates the central position of the wafer 140. The edge line is a line that is formed between the wafer 140 and the background outside the wafer 140. Depending on embodiments, the edge line may be a line that is formed between the shadow of the wafer 140 and the gauge (a reflection plate). Detailed description in relation to this is provided hereafter.

Figure 2:
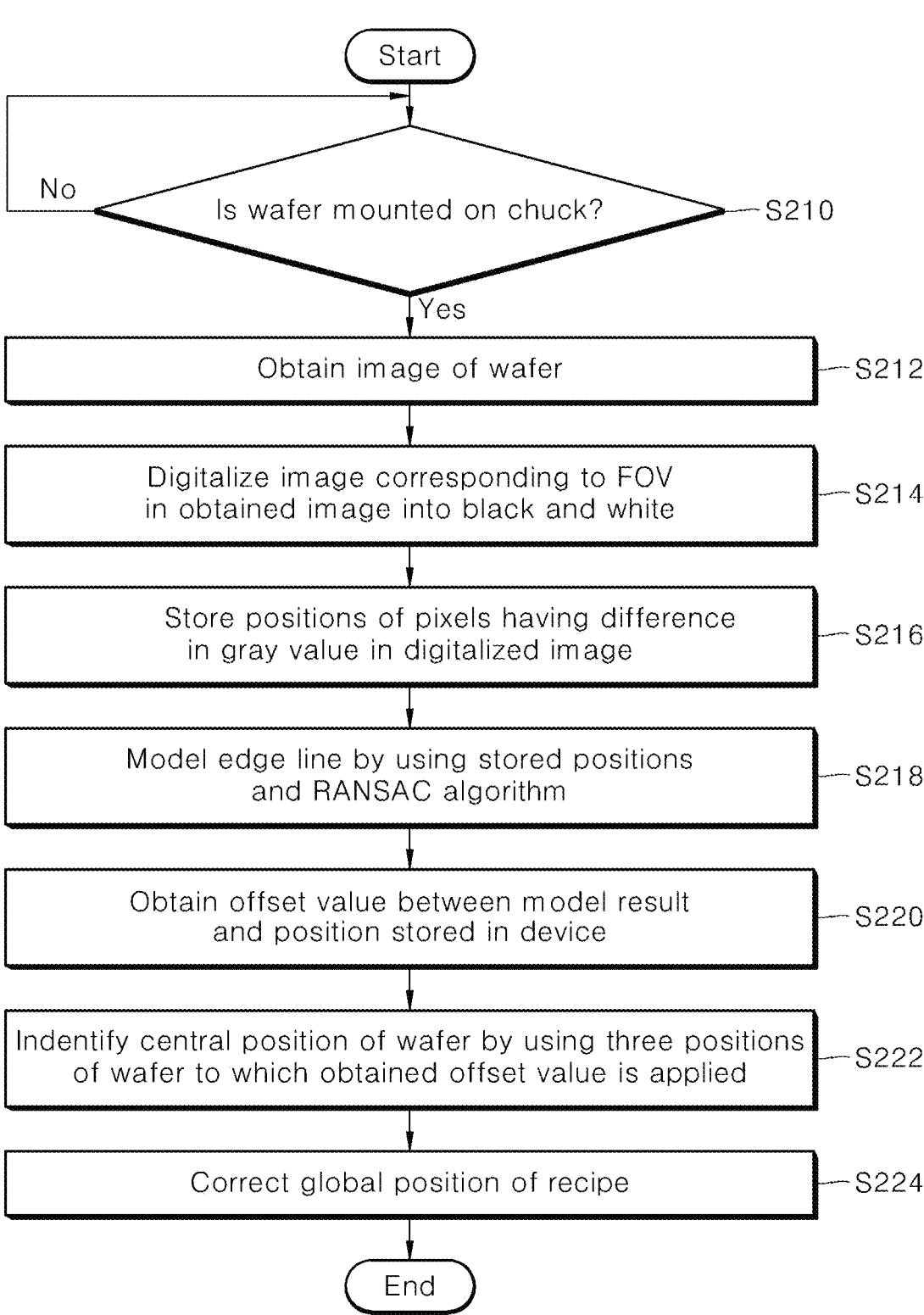
FIG. 2 is a flowchart showing an arrangement method of one embodiment.
Figure 3:
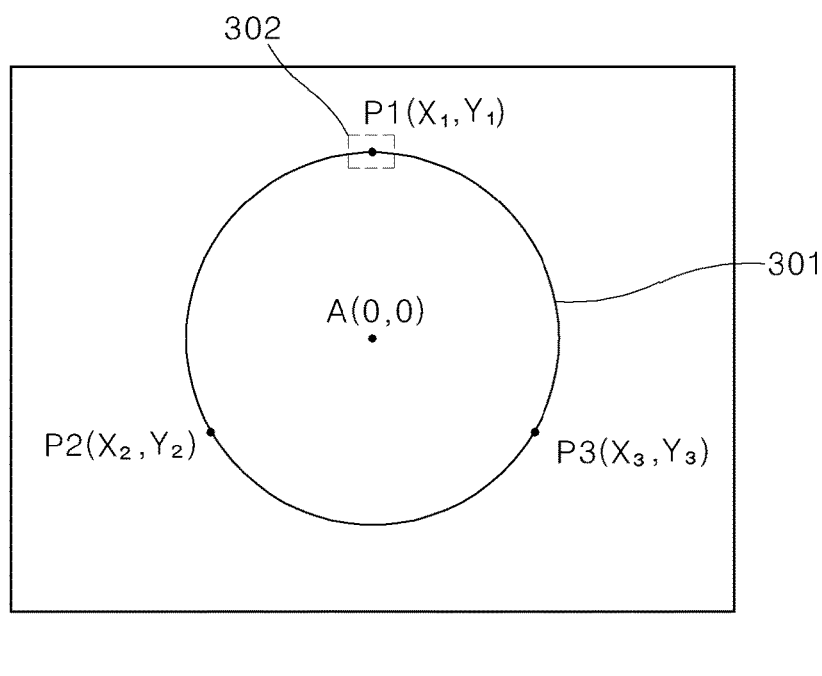
FIG. 3 is a view showing three reference points and a reference center in the arrangement method of one embodiment.
Figure 4:
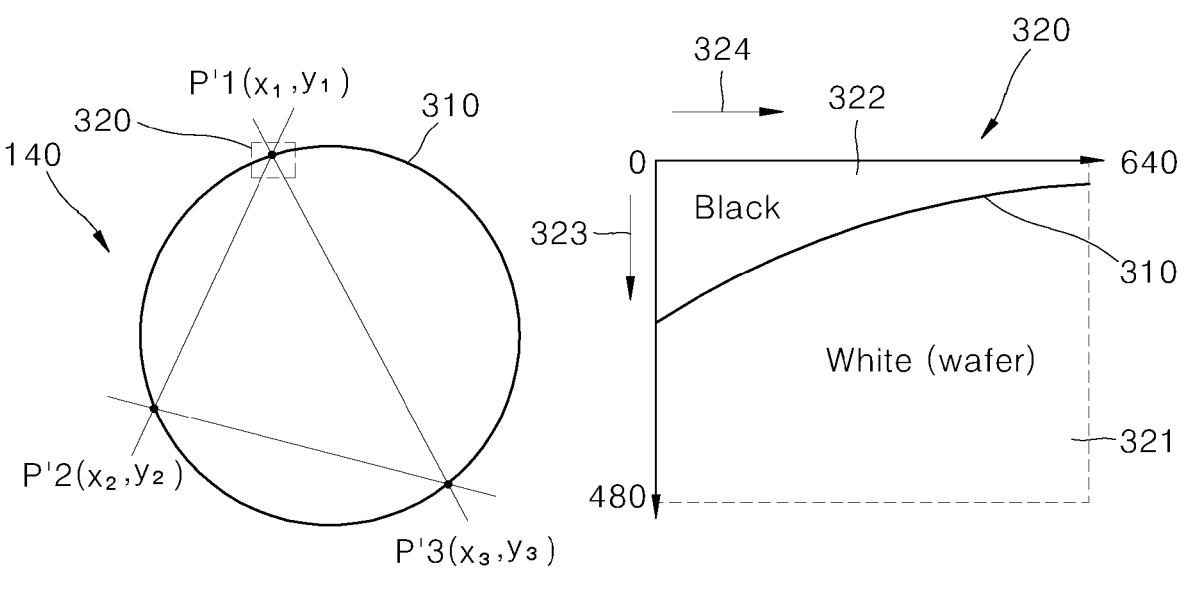
FIG. 4 is a view showing the modeling of three detection points and an edge line in the arrangement method of one embodiment.
Figure 5:
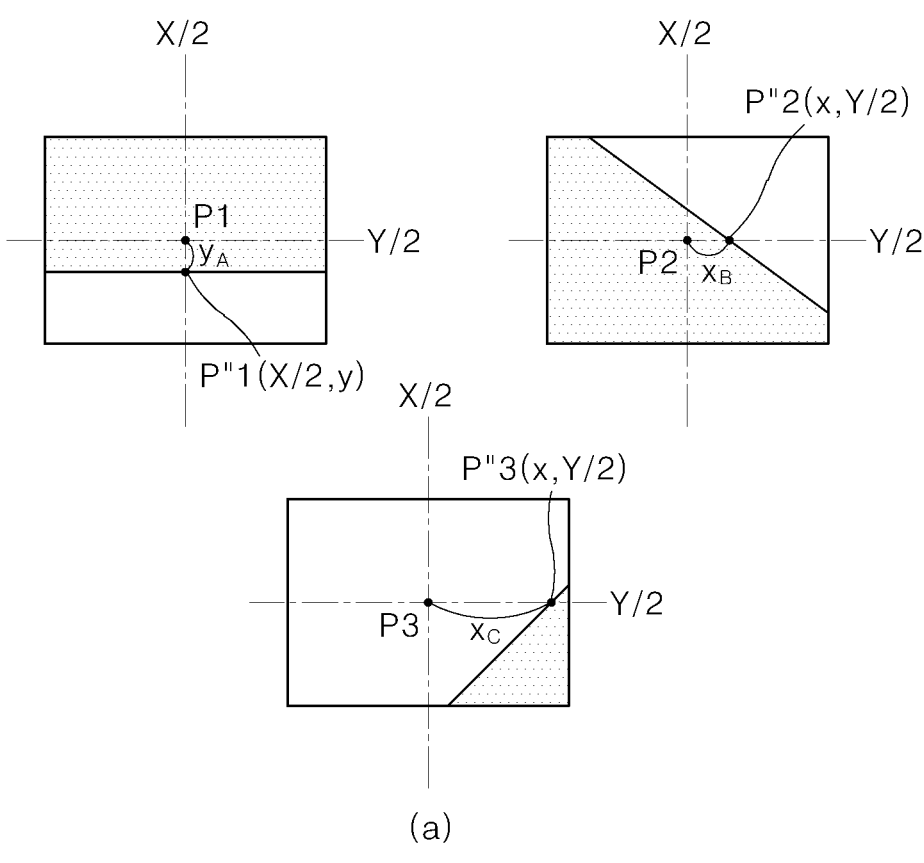
FIG. 5 is a view showing three correction points and a correction center in the arrangement method of one embodiment.
Figure 5:
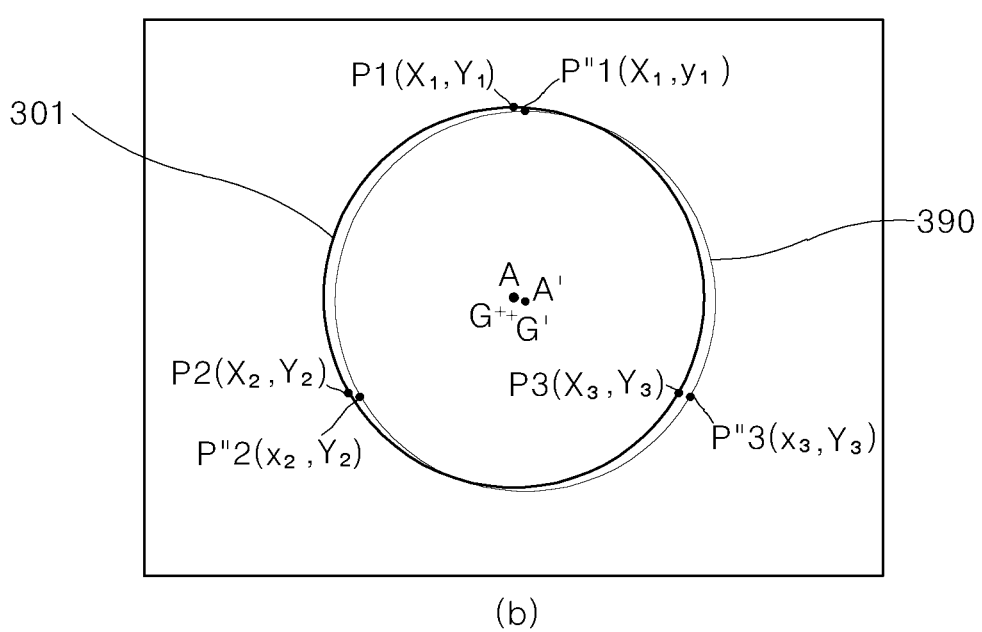

FIG. 2 is a flowchart showing an arrangement method of one embodiment, FIG. 3 is a view showing three reference points and a reference center in the arrangement method of one embodiment, FIG. 4 is a view showing the modeling of three detection points and an edge line in the arrangement method of one embodiment, and FIG. 5 is a view showing three correction points and a correction center in the arrangement method of one embodiment.

Hereafter, an arrangement method in which the arrangement device of one embodiment identifies the central position of a wafer is described, with reference to FIGS. 2 to 5.

According to the present disclosure, when a device identifying the central position of a wafer is set for the first time, three reference points P1, P2, P3 are stored in the memory (not illustrated). The three reference points P1, P2, P3 are disposed on the edge line 301 of a wafer that becomes a reference.

As shown in FIG. 3(b), the three reference points P1, P2, P3 are placed at the center of an FOV 302. That is, reference point P1 $(X_1, Y_1)$ is placed at half (X/2) of the width of the FOV 302 and half (Y/2) of the height of the FOV 302. Likewise, P2 $(X_2, Y_2)$ and P3 $(X_3, Y_3)$ are also placed at half (X/2) of the width of the FOV 302 and half (Y/2) of the height of the FOV 302. In the coordinate system of the wafer, the reference center A, which is the center of the wafer calculated by using the three reference points (P1, P2, P3), is placed at (0, 0).

After the above-described setting, a processor 170 determines whether the wafer 140 is mounted on a chuck (S210), and when confirming that the wafer 140 is mounted on the chuck, obtains an image of the wafer (S212). The processor 170 obtains the image of the wafer 140 mounted on the chuck, through a detector 131. Referring to FIG. 4(a), the processor 170 moves the screen of the detector 131 to the positions of the three reference points P1, P2, P3 to obtain the image seen in the FOV 302. At this time, three detected points P'1, P'2, P'3 are on the edge line 310 of the wafer 140 in the obtained image, but are not placed at the center of the FOV 302 and different from the reference points P1, P2, P3.

The processor 170 digitalizes the obtained image as black and white (S214). The processor 170 digitalizes the image in the FOV 320 that is obtained in any one (in the embodiment, P1) of the positions of the three reference points P1, P2, P3, such that the digitalized image can become a black area 322 where the gray value (contrast value) of a pixel is 0 or a white area 321 where the gray value of a pixel is 255, as shown in FIG. 4(b). In the method of digitalizing an image, various algorithms may be used, and in the embodiment, the processor 170 stores the number of gray values of each pixel of an image and calculates a ratio for the entire pixel of each gray value to calculate a threshold, and compares the gray value and the threshold to restructure the gray value of a pixel to 0 or 255 and digitalize the image.

The processor 170 stores the positions of pixels the gray values of which differ in the digitalized image (S216). Referring to FIG. 4(b) and FIG. 4(c), the processor 170 finds the positions of pixels 340 the gray values of which are different from the gray value of a following pixel 350 by 255, while moving in a perpendicular direction 323 in a currently pixel 350 of the digitalized image. The processor 170 moves from a pixel 322 of a gray value of 0 (black) to a pixel 321 of a gray value of 255 (white). The processor 170 finds the position of a pixel 340 the gray value of which is different from the gray value of a following pixel 350 by 255, while moving in the perpendicular direction 323. After finding the position of a pixel 340 having a difference in the gray value in the perpendicular direction 323, the processor 170 moves by one pixel in a horizontal direction 324, and while moving again in the perpendicular direction 323, finds the position of a pixel having a difference in the gray value. The processor 170 stores the positions of the above pixels 340 having a difference in the gray value, based on the above-described method. In the embodiment, the perpendicular direction 323 is a top-down direction, but depending on an obtained image, may be a bottom-up direction in which the movement is made from the pixel 321 of a gray value of 255 (white) to the pixel 322 of a gray value of 0 (black).

The processor 170 models an edge line by using the stored positions and a Random Sample Consensus (RANSAC) algorithm (S218). The processor 170 recognizes the position of each of the pixels 340 having a difference in the gray value as one dot, and fits the dot with the RANSAC algorithm to model the edge line 310 of a wafer 140.

The processor 170 performs steps 214, 216 and 218 consecutively with respect to each of the images obtained at the three reference points P1, P2, P3 to model the edge line 310 in each of the images.

The processor 170 obtains an offset value between a resultant model 390 and the position stored in the device (S220). The processor 170 calculates the offset value of a dot that has an X value or a Y value the same as those of the three reference points P1, P2, P3, on the modeled edge line 390.

Referring to FIG. 5(a), the processor 170 calculates the offset value $y_A$ of a correction point P"1 passing half X/2 of the width of the FOV 302 on the edge line 390 that is modeled from the image obtained at P1 among the three reference points P1, P2, P3. Additionally, the processor 170 calculates the offset value $x_B$ of a correction point P"2 passing half Y/2 of the height of the FOV 302 on the edge line 390 that is modeled from the image obtained at P2, and calculates the offset value $x_C$ of a correction point P"3 passing half Y/2 of the height of the FOV 302 on the edge line 390 that is modeled from the image obtained at P3. That is, the processor 170 calculates the offset value $y_A$ of the correction point P"1 that has an X value the same as that of P1 on the modeled edge line 390, and calculates the offset value $x_B$ of the correction value P"2 that has a Y value the same as that of P2, and calculates the offset value $x_C$ of the correction point P"3 that has a Y value the same as that of P3.

The processor 170 identifies the central position of a wafer by using three positions of the wafer, to which the obtained offset values are applied (S222).

The processor 170 calculates the positions of the three correction points P"1, P"2, P"3 as the offset values $y_A$, $x_B$, $x_C$ with respect to the three reference points P1, P2, P3. The X value of the correction point P"1 is $X_1$ the same as the X value of the reference point P1, and the Y value of the correction point P"1 is $Y_1+y_A$ where the offset value $y_A$ is added to $Y_1$ that is the Y value of the reference point P1. The X value of the correction point P"2 is $X_2+x_B$ where the offset value $x_B$ is added to $X_2$ that is the X value of the reference point P2, and the Y value of the correction point P"2 is $Y_2$ the same as the Y value of the reference point P2. The X value of the correction point P"3 is $X_3+x_C$ where the offset value $x_C$ is added to $X_3$ that is the X value of the reference point P3, and the Y value of the correction point P"3 is $Y_3$ the same as the Y value of the reference point P3. That is, the coordinates of the three correction points P"1, P"2, P"3 are described as follows.

$$P''1(X_1, Y_1 + y_A)$$
$$P''2(X_2 + x_B, Y_2)$$
$$P''3(X_3 + x_c, Y_3)$$

The processor 170 calculates the correction center A' of the modeled edge line 390 by using the positions of the three correction points P"1, P"2, P"3 of the wafer, to which the obtained offset values are applied. The processor 170 calculates the correction center A' from the three correction points P"1, P"2, P"3 by using an equation of a circle.

The processor 170 corrects the global position of a recipe for measuring characteristics of a wafer 140 (S224). The processor 170 calculates a center offset (O, O=A'−A) from the calculated correction center A' and the reference center A and then calculates a corrected global position G' by adding the center offset O to the global position G of the recipe. Since the reference center A is (0, 0), the corrected global position G' is calculated by adding the correction center A' to the global position G of the recipe.

Figure 6:
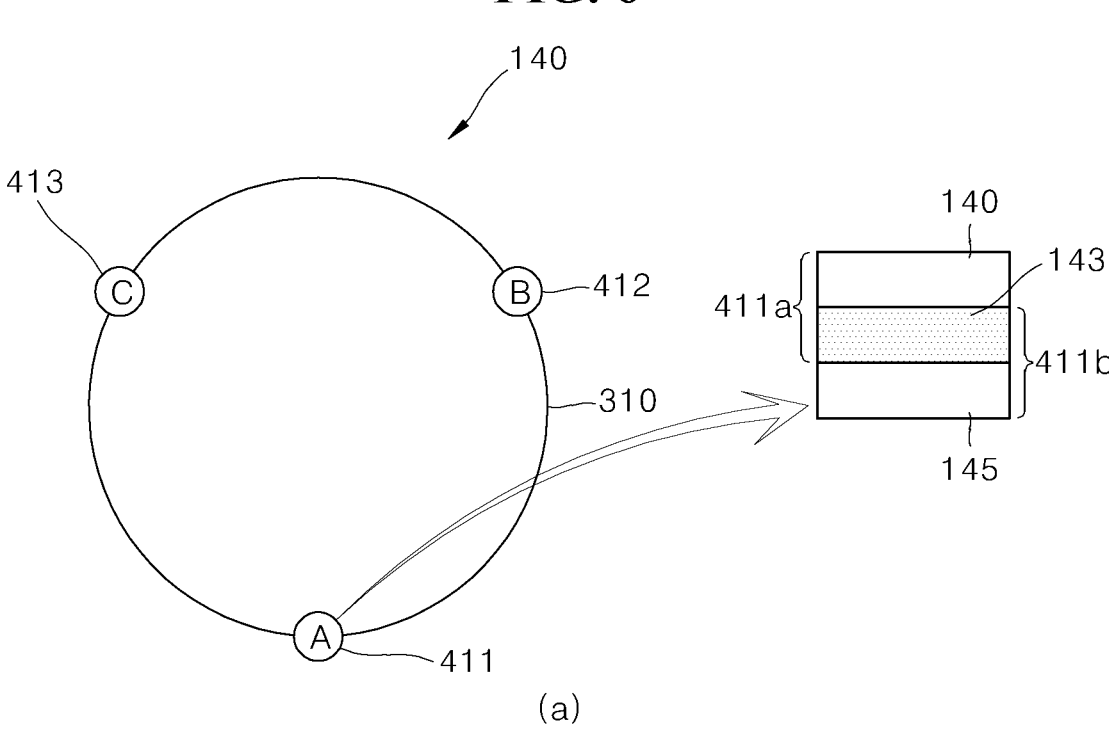
FIG. 6 is a view showing the modeling of an edge line, with a gauge, in an arrangement method of another embodiment.
Figure 6:
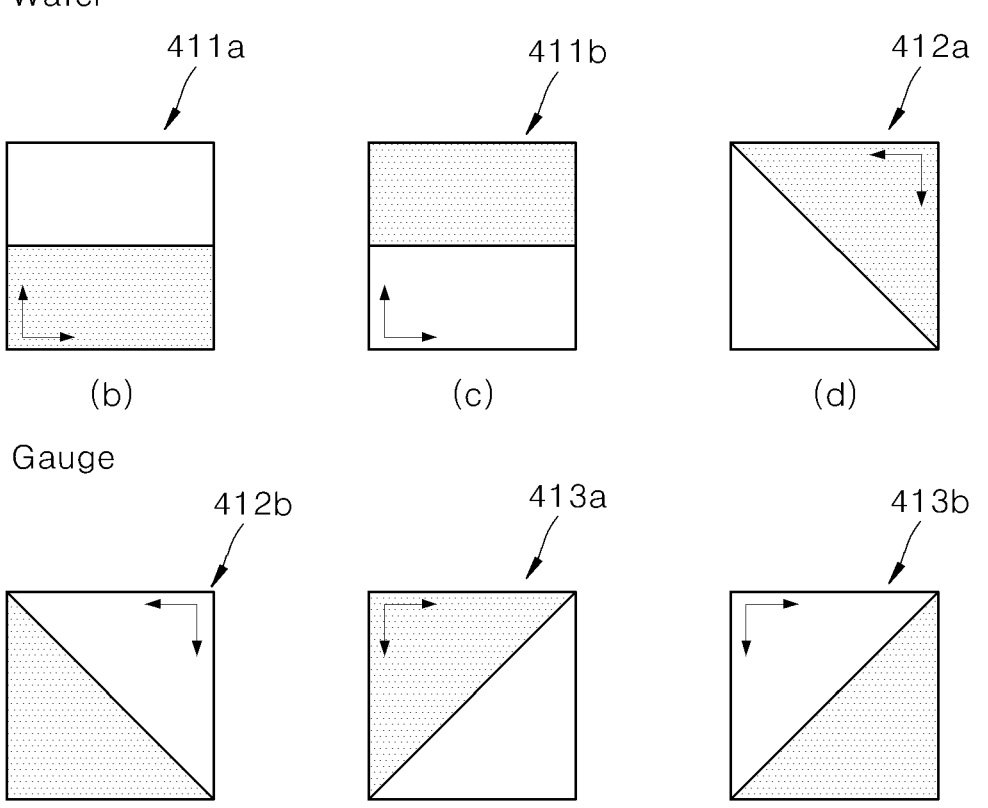

FIG. 6 is a view showing the modeling of an edge line, with a gauge, in an arrangement method of another embodiment.

In the arrangement method of another embodiment, a more precise edge line may be obtained by using a gauge (reflection plate).

FIG. 6(a) shows three reference points 411, 412, 413 that are comprised of a wafer 140, the shadow 143 of the wafer and a gauge 145, on the edge line 310 of the wafer 140. In the arrangement method of another embodiment, three gauges (reflection plates) are disposed at three reference points 411, 412, 413 of a chuck on which the wafer 140 is mounted. At a reference point A 411, the wafer 140, the shadow 143 of the wafer, and the gauge 145 are disposed consecutively, in a top-down manner.

Images, seen at the reference point A 411 in the FOV 320, comprises a wafer image 411a that is comprised of the wafer 140 and the shadow 143 of the wafer, as shown in FIG. 6(b), and a gauge image 411b that is comprised of the shadow 143 of the wafer and the gauge 145, as shown in FIG. 6(c). Additionally, images, seen at the reference point B 412 in the FOV 320, comprises a wafer image 412a that is comprised of the wafer 140 and the shadow 143 of the wafer, as shown in FIG. 6(d), and a gauge image 412b that is comprised of the shadow 143 of the wafer and the gauge 145, as shown in FIG. 6(e). Images, seen at the reference point C 413 in the FOV 320, comprises a wafer image 413a that is comprised of the wafer 140 and the shadow 143 of the wafer, as shown in FIG. 6(F), and a gauge image 413b that is comprised of the shadow 143 of the wafer and the gauge 145, as shown in FIG. 6(G).

In the wafer image 411a, 412a, 413a comprised of the wafer 140 and the shadow 143 of the wafer, the processor 170 finds the position of a pixel the gray value of which is different from the gray value of a following pixel by 255, while moving from a pixel of a gray value of 0 (black) to a pixel of a gray value of 255 (white) in the perpendicular direction, moves by one pixel in the horizontal direction, and finds the position of a pixel having a difference in the gray value, while moving again in the perpendicular direction.

In the gauge image 411*b*, 412*b*, 413*b* comprised of the shadow 143 of the wafer and the gauge 145, the processor 170 finds the position of a pixel the gray value of which is different from the gray value of a previous pixel by 255, while moving from a pixel of a gray value of 255 (white) to a pixel of a gray value of 0 (black) in the perpendicular direction, moves by one pixel in the horizontal direction, and finds the position of a pixel having a difference in the gray value, while moving again in the perpendicular direction.

An edge line may be modeled precisely, with the pixels found in the wafer image 411*a*, 412*a*, 413*a* and/or the pixels found in the gauge image 411*b*, 412*b*, 413*b*.

Each of the above-described steps in the flowcharts may be performed regardless of the order illustrated, or performed at the same time. Further, in the present disclosure, at least one of the components, and at least one operation performed by at least one of the components can be embodied as hardware and/or software.

The embodiments are described above with reference to a number of illustrative embodiments thereof. However, embodiments are not limited to the embodiments and drawings set forth herein, and numerous other modifications and embodiments can be drawn by one skilled in the art within the technical scope of the disclosure. Further, the effects and predictable effects based on the configurations in the disclosure are to be included within the range of the disclosure though not explicitly described in the description of the embodiments.

DESCRIPTION OF REFERENCE NUMERALS

100: Arrangement device
110: Light source
118: Relay lens
120: Objective lens
124: Beam splitter
125: Lens focus actuator
131: Detector
170: Processor

The invention claimed is:

1. An arrangement device, comprising:
a detector comprising an image sensor configured to obtain an image in a field of view (FOV) of a wafer; and
a processor digitalizing the obtained image into black and white to model an edge line, and identifying a central position of the wafer by using the modeled edge line,
wherein the processor stores three reference points placed at half of a width and half of a height of the FOV, and obtains the image at each of the three reference points, and
wherein the processor calculates three correction points having an X value or a Y value that are the same as those of the three reference points, on the modeled edge line.

2. The arrangement device of claim 1, wherein the processor stores the number of gray values of each pixel of the obtained image, calculates a ratio for the entire pixels of each of the gray values to calculate a threshold, and compares the gray value and the threshold to restructure a gray value of a pixel to 0 or 255 and digitalize an image.

3. The arrangement device of claim 1, wherein the processor moves in a perpendicular direction and/or a horizontal direction in the digitalized image, or finds positions of pixels, gray values of which are different from a gray value of a following pixel, to model the edge line.

4. The arrangement device of claim 3, wherein the processor recognizes the positions of the pixels having a difference in the gray value as a dot, and fits the dot with a Random Sample Consensus (RANSAC) algorithm, to model the edge line.

5. The arrangement device of claim 1, wherein the processor calculates three correction points on the modeled edge line.

6. The arrangement device of claim 1, wherein the processor calculates a correction center of the modeled edge line from the three correction points.

7. The arrangement device of claim 6, wherein the processor calculates a center offset from the correction center, and then corrects a global position of a recipe for measurement.

8. The arrangement device of claim 1, wherein the obtained image is comprised of the wafer and a background of the wafer, or the wafer and a shadow of the wafer, or a shadow of the wafer and a reflection plate.

9. An arrangement method, comprising:
obtaining an image in an FOV of a wafer;
digitalizing the obtained image into black and white;
modeling an edge line in the digitalized image; and
identifying a central position of the wafer by using the modeled edge line,
wherein the arrangement method further comprises storing three reference points placed at half of a width and half of a height of the FOV, and obtaining the image comprises obtaining an image at each of the three reference points,
wherein identifying a central position comprises calculating three correction points having an X value or a Y value that are the same as those of the three reference points, on the modeled edge line.

10. The arrangement method of claim 9, wherein digitalizing comprises storing the number of gray values of each pixel of the obtained image, calculating a ratio for the entire pixels of each of the gray values to calculate a threshold, and comparing the gray value and the threshold to restructure a gray value of a pixel to 0 or 255 and digitalize an image.

11. The arrangement method of claim 9, wherein modeling an edge line comprises moving in a perpendicular direction and/or a horizontal direction in the digitalized image, or finding positions of pixels, gray values of which are different from a gray value of a following pixel, to model the edge line.

12. The arrangement method of claim 11, wherein modeling an edge line comprises recognizing the positions of the pixels having a difference in the gray value as a dot, and fitting the dot with a Random Sample Consensus (RANSAC) algorithm, to model the edge line.

13. The arrangement method of claim 9, wherein the arrangement method further comprises calculating three correction points on the modeled edge line.

14. The arrangement method of claim 9, wherein identifying a central position further comprises calculating a correction center of the modeled edge line from the three correction points.

15. The arrangement method of claim 14, wherein identifying a central position further comprises calculating a center offset from the correction center and then correcting a global position of a recipe for measurement.

\* \* \* \* \*